United States Patent
Broussard et al.

(10) Patent No.: US 9,485,889 B2
(45) Date of Patent: Nov. 1, 2016

(54) MEDIUM VOLTAGE HYBRID AIR/LIQUID COOLED ADJUSTABLE FREQUENCY DRIVE

(71) Applicant: Eaton Corporation, Cleveland, OH (US)

(72) Inventors: Harry Broussard, Arden, NC (US); Thomas Arthur Farr, Candler, NC (US)

(73) Assignee: EATON CORPORATION, Cleveland, OH (US)

( * ) Notice: Subject to any disclaimer, the term of this patent is extended or adjusted under 35 U.S.C. 154(b) by 344 days.

(21) Appl. No.: 13/967,382

(22) Filed: Aug. 15, 2013

(65) Prior Publication Data

US 2015/0049437 A1     Feb. 19, 2015

(51) Int. Cl.
H05K 7/20     (2006.01)
H01L 23/46    (2006.01)

(52) U.S. Cl.
CPC ........... *H05K 7/20509* (2013.01); *H01L 23/46* (2013.01); *H05K 7/20927* (2013.01)

(58) Field of Classification Search
None
See application file for complete search history.

(56) References Cited

U.S. PATENT DOCUMENTS

| | | | |
|---|---|---|---|
| 6,000,912 A | 12/1999 | Takada et al. | |
| 6,038,156 A | 3/2000 | Inam et al. | |
| 6,166,937 A | 12/2000 | Yamamura et al. | |
| 7,816,631 B2 | 10/2010 | Cramer | |
| 7,839,641 B2* | 11/2010 | Baba | H01L 23/24 165/104.19 |
| 7,876,561 B2* | 1/2011 | Schnetzka | F25B 49/025 180/297 |
| 8,149,579 B2* | 4/2012 | Jadric | H05K 7/20936 165/80.4 |
| 8,159,823 B2* | 4/2012 | Murakami | H01L 23/473 180/243 |
| 8,319,463 B2 | 11/2012 | Sasaki et al. | |
| 8,325,478 B2 | 12/2012 | Siracki et al. | |
| 8,335,081 B2 | 12/2012 | Weiss | |
| 8,467,188 B2* | 6/2013 | Hsieh | H05K 7/20927 174/548 |
| 2006/0174642 A1* | 8/2006 | Nagashima | F28D 15/00 62/259.2 |
| 2007/0258219 A1* | 11/2007 | Howes | H05K 7/1432 361/728 |
| 2012/0320529 A1 | 12/2012 | Loong et al. | |
| 2013/0063897 A1* | 3/2013 | Howes | H05K 7/20936 361/700 |

FOREIGN PATENT DOCUMENTS

| | | |
|---|---|---|
| DE | 10 2011 100 543 A1 | 11/2012 |
| EP | 2 709 431 A1 | 3/2014 |
| WO | 2012/153414 A1 | 11/2012 |

OTHER PUBLICATIONS

European Patent Office, "partial International Search Report", Feb. 17, 2015, 6 pp.

* cited by examiner

*Primary Examiner* — Courtney Smith
(74) *Attorney, Agent, or Firm* — Eckert Seamans; David Jenkins; Philip Levy

(57) ABSTRACT

An adjustable frequency drive including a number of power modules and a heat management system is provided. Each of the number of power modules includes a number of inverters. Each inverter includes a number of power poles. The heat management system includes a housing assembly, a first heat management assembly, and a second heat management assembly. The housing assembly defines a power module enclosure and a liquid cooling assembly enclosure. The first heat management assembly is substantially disposed in the power module enclosure. The second heat management assembly is not substantially disposed in the power module enclosure.

4 Claims, 5 Drawing Sheets

MEDIUM VOLTAGE HYBRID AIR/LIQUID COOLED ADJUSTABLE FREQUENCY DRIVE

BACKGROUND OF THE INVENTION

1. Field of the Invention

The disclosed and claimed concept relates to an adjustable frequency drive and, more particularly, to a hybrid heat management system for an adjustable frequency drive.

2. Background Information

Adjustable frequency drives are commonly used to drive AC induction motors allowing for its speed control. Adjustable frequency drives generally provide the advantage of energy savings because they control the characteristics of its output voltage and current, and thus controlling the motor speed (of the motor they are driving) by the user, optimizing the motor power usage as well as the process it is driving. Adjustable frequency drives operate by taking either incoming AC or DC power, having a fixed frequency and voltage, and converting it to AC power having a voltage or current with variable amplitude and frequency. This allows for the control of the motor speed and power, a requirement in many applications.

An adjustable frequency drive includes a number of power modules. Each power module includes a number of inverters and a transformer. The inverters and a transformer are electrically coupled through electrical buses and physically coupled through their respective bases. Each inverter includes a number of power poles. Each power pole includes, among other elements, a number of power semiconductor switches, a power supply and a gate driver, thermally coupled thereto, a plurality of capacitors, a plurality of electrical buses connecting the power semiconductor switches to the capacitors, and an insulative medium which encases or covers some or all of the electrically live components, such as the electrical buses.

An adjustable frequency drive generates heat and is, generally, disposed in enclosed housing. To dissipate the heat, the adjustable frequency drive includes a cooling system. Due to the amount of heat generated, adjustable frequency drives use a circulating liquid. That is, heat management assemblies such as, but not limited to, a forced air assembly or a heat sink, do not provide sufficient heat transfer so as to maintain the adjustable frequency drive at an operating temperature.

The power poles may share a common cooling system. That is, an AC drive is made up of a plurality of inverter modules, which are connected to a converter module to create the AC drive, wherein each of the above components is mounted on a cold plate coupled to a heat exchanger or liquid cooling system. Generally, the power poles are coupled directly to the cold plate and a number of power semiconductor switches, also identified as "cells," are in fluid communication with the cold plate.

That is, the liquid cooling system for an inverter includes a primary cold plate, a number of cell cold plates, a forced air heat exchanger, and a plurality of conduits. The "primary cold plate," as used herein, is a plate sized to accommodate a number of inverters being coupled directly thereto. A "cell cold plate" is a smaller element sized to accommodate a semiconductor switch, see e.g., U.S. Pat. No. 6,166,937. The conduits include transfer conduits, internal conduits, and cell conduits. The transfer conduits include a supply conduit and a return conduit. The transfer conduits are coupled to, and in fluid communication with, the forced air heat exchanger. The internal conduits are passages within a generally planar cold plate. The passages are, in one embodiment, labyrinthine. The cold plate includes a cool liquid supply port (inlet), a warm liquid port (outlet), and a number of cell ports, including both inlet and outlet ports. The cell conduits are coupled to, and in fluid communication with, the cell ports.

Thus, the liquid cooling system operated as follows. Cool fluid, i.e. a liquid coolant, is transferred from the heat exchanger via the supply conduit to the primary cold plate. Within the primary cold plate, the fluid absorbed heat from the inverter. A portion of the cool fluid, now somewhat heated, was further passed to the number of cell cold plates via the cell conduits. The fluid would absorb further heat from the individual cell cold plates before returning to the primary cold plate. The now warm fluid exited the primary cold plate and was transferred to the heat exchanger via the return conduit. The fluid was then cooled in the heat exchanger and cycled through the liquid cooling system again. With regard to the cell cold plates, there are a plurality of cells for each inverter; in one embodiment, there are eighty-eight cells. In this configuration, there are 176 cell conduits either providing cool liquid to, or removing warm liquid from, various cells.

Further, the forced air heat exchanger is located at a location separated from the inverter. That is, the forced air heat exchanger was spaced from the inverter housing assembly enclosure, and/or, disposed in a generally enclosed housing that was separate from the inverter housing assembly enclosure. Thus, moving air did not pass over the inverter. Thus, one reason each cell needed to be coupled to the liquid cooling system was that the liquid cooling system was to only cool the system within the inverter housing assembly enclosure.

Each conduit and port has the potential to leak. This is a disadvantage as the conduits tend to be disposed adjacent to the electrical components. Further, when a power pole needed to be removed, each conduit had to be decoupled from the primary cold plate. Thus, in the exemplary power pole discussed above, 176 conduits needed to be decoupled. This is a disadvantage because the removal of the power poles was labor intensive and because each decoupled conduit provided a potential for contaminating the cooling fluid.

There is, therefore, a need for a primary cold plate including a limited number of fluid ports. There is a further need for an inverter wherein the power poles are cooled by more than a single cooling system.

SUMMARY OF THE INVENTION

These needs, and others, are met by at least one embodiment of this invention which provides an adjustable frequency drive including a number of power modules and a heat management system. Each of the number of power modules includes a number of inverters. Each inverter includes a number of power poles. The heat management system includes a housing assembly, a first heat management assembly, and a second heat management assembly. The housing assembly defines a power module enclosure and a liquid cooling assembly enclosure. The first heat management assembly is substantially disposed in the power module enclosure. The second heat management assembly is not substantially disposed in the power module enclosure.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
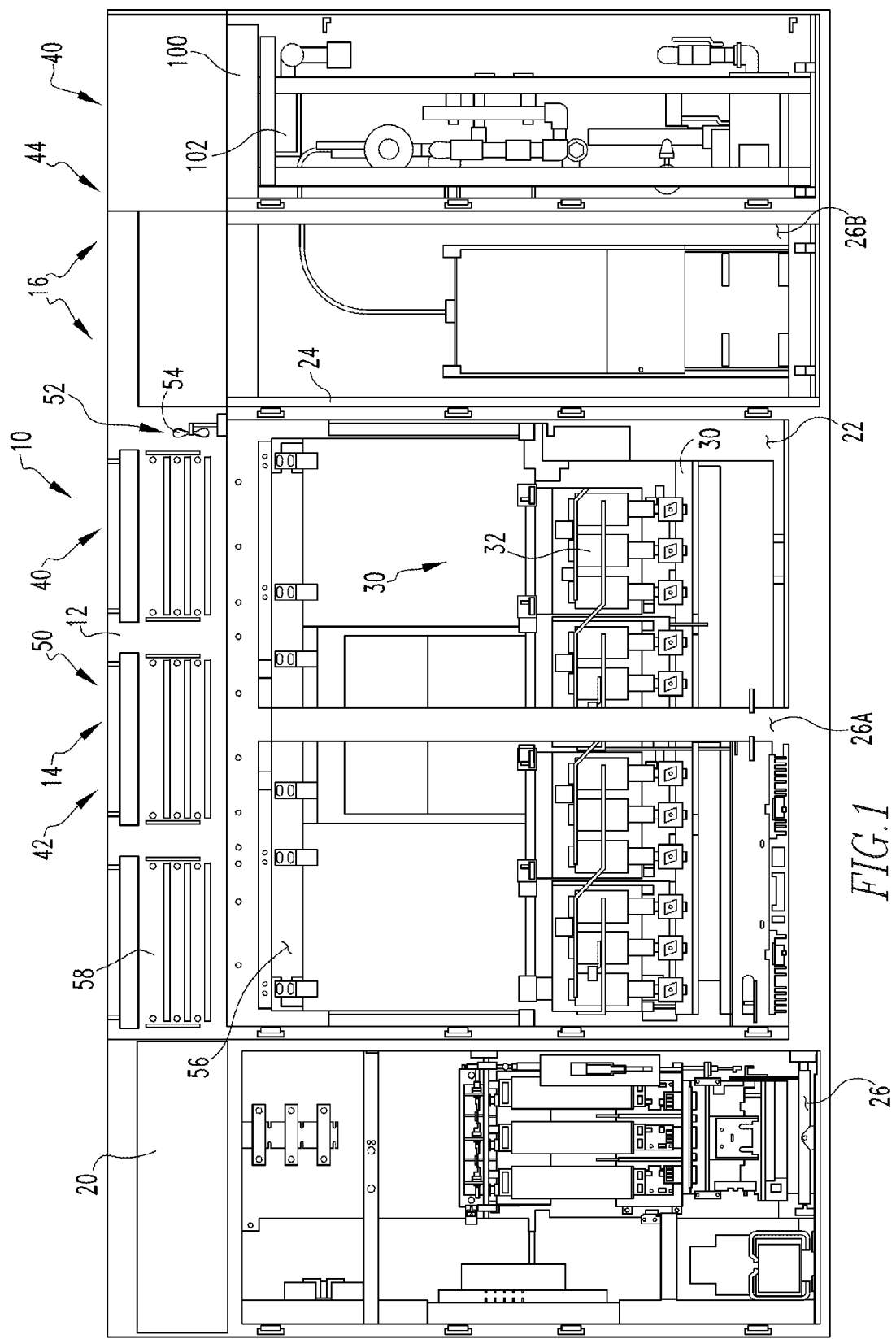
FIG. 1 is a front side view of an adjustable frequency drive.

It will be appreciated that the specific elements illustrated in the figures herein and described in the following specification are simply exemplary embodiments of the disclosed concept, which are provided as non-limiting examples solely for the purpose of illustration. Therefore, specific dimensions, orientations and other physical characteristics related to the embodiments disclosed herein are not to be considered limiting on the scope of the disclosed concept.

Directional phrases used herein, such as, for example, clockwise, counterclockwise, left, right, top, bottom, upwards, downwards and derivatives thereof, relate to the orientation of the elements shown in the drawings and are not limiting upon the claims unless expressly recited therein.

As used herein, the singular form of "a," "an," and "the" include plural references unless the context clearly dictates otherwise.

As used herein, the statement that two or more parts or components are "coupled" shall mean that the parts are joined or operate together either directly or indirectly, i.e., through one or more intermediate parts or components, so long as a link occurs. As used herein, "directly coupled" means that two elements are directly in contact with each other. As used herein, "fixedly coupled" or "fixed" means that two components are coupled so as to move as one while maintaining a constant orientation relative to each other. Accordingly, when two elements are coupled, all portions of those elements are coupled. A description, however, of a specific portion of a first element being coupled to a second element, e.g., an axle first end being coupled to a first wheel, means that the specific portion of the first element is disposed closer to the second element than the other portions thereof.

As used herein, the statement that two or more parts or components "engage" one another shall mean that the elements exert a force or bias against one another either directly or through one or more intermediate elements or components.

As used herein, the word "unitary" means a component is created as a single piece or unit. That is, a component that includes pieces that are created separately and then coupled together as a unit is not a "unitary" component or body.

As used herein, the term "number" shall mean one or an integer greater than one (i.e., a plurality).

As used herein, a "coupling assembly" includes two or more couplings or coupling components. The components of a coupling or coupling assembly are generally not part of the same element or other component. As such the components of a "coupling assembly" may not be described at the same time in the following description.

As used herein, a "coupling" or "coupling component(s)" is one or more component(s) of a coupling assembly. That is, a coupling assembly includes at least two components that are structured to be coupled together. It is understood that the components of a coupling assembly are compatible with each other. For example, in a coupling assembly, if one coupling component is a snap socket, the other coupling component is a snap plug, or, if one coupling component is a bolt, then the other coupling component is a nut.

As used herein, "associated" means that the elements are part of the same assembly and/or operate together, or, act upon/with each other in some manner. For example, an automobile has four tires and four hub caps. While all the elements are coupled as part of the automobile, it is understood that each hubcap is "associated" with a specific tire.

As used herein, "correspond" indicates that two structural components are sized and shaped to be similar to each other and may be coupled with a minimum amount of friction. Thus, an opening which "corresponds" to a member is sized slightly larger than the member so that the member may pass through the opening with a minimum amount of friction. This definition is modified if the two components are said to fit "snugly" together or "snuggly correspond." In that situation, the difference between the size of the components is even smaller whereby the amount of friction increases. If the element defining the opening and/or the component inserted into the opening are made from a deformable or compressible material, the opening may even be slightly smaller than the component being inserted into the opening. This definition is further modified if the two components are said to "substantially correspond." "Substantially correspond" means that the size of the opening is very close to the size of the element inserted therein; that is, not so close as to cause substantial friction, as with a snug fit, but with more contact and friction than a "corresponding fit," i.e., a "slightly larger" fit.

As used herein, "structured to [verb]" means that the identified element or assembly has a structure that is shaped, sized, disposed, coupled and/or configured to perform the identified verb. For example, a member that is "structured to move" is movably coupled to another element and includes elements that cause the member to move or the member is otherwise configured to move in response to other elements or assemblies.

As used herein, "thermally coupled" means elements that are coupled so that a substantial amount of heat travels between the elements by conduction. For example, two elements coupled with an insulative material therebetween are not "thermally coupled," whereas two elements that are directly coupled or coupled by a thermally conductive material are "thermally coupled."

As used herein, heat management assemblies operate by different principles. Different principles of operation for heat management assemblies include, but are not limited to: (1) conduction, wherein two elements are thermally coupled to each other, such as a heat sink coupled to a semiconductor, (2) conduction with external fluid flow, wherein two elements are thermally coupled to each other and wherein a fluid is flowing over the heat sink element, such as a heat sink coupled to a semiconductor with a fan forcing air flow over the heat sink, (3) conduction with internal fluid flow, wherein two elements are thermally coupled to each other and wherein a fluid is flowing through the cooling element, such as a cold plate coupled to a semiconductor with a liquid flowing through the cold plate, (4) convection, wherein a fluid is flowing over the element being cooled, such as a semiconductor with a fan forcing air flow thereover, and (5) thermal radiation, wherein an element radiates heat via emission of electromagnetic waves. It is noted that all objects emit electromagnetic waves thus, a thermal radiation heat management assembly is one wherein the majority of heat is transferred via electromagnetic waves as opposed to some other means. Further, it is noted that in other heat management assemblies the emission of electromagnetic waves accounts for an insubstantial amount of heat transfer and is ignored.

As shown in FIG. 1, an adjustable frequency drive 10 includes a housing assembly 12, a number of power modules 14, and a heat management system 16. In an exemplary embodiment, the housing assembly 12 includes a number of external, generally planar sidewalls 20 coupled to each other and forming a parallelepiped defining an enclosed space 22. The housing assembly 12 further includes a number of internal, generally planar sidewalls 24 coupled to the external sidewalls 20 and/or other internal sidewalls 24. Further, as is known, but not shown, an external sidewall 20, or a portion of an external sidewall 20 is movable or removable and acts as a door allowing ingress to the enclosed space 22. The internal sidewalls 24 divide the enclosed space 22 into a number of enclosed compartments or "enclosures 26." Each enclosure 26 is identified by the components disposed therein. For example, there is a power module enclosure 26A which is the enclosure that substantially, or entirely, encloses a power module 14. As discussed below, the housing assembly 12 is also associated with the heat management system 16 and is considered a part thereof as well.

Figure 2:
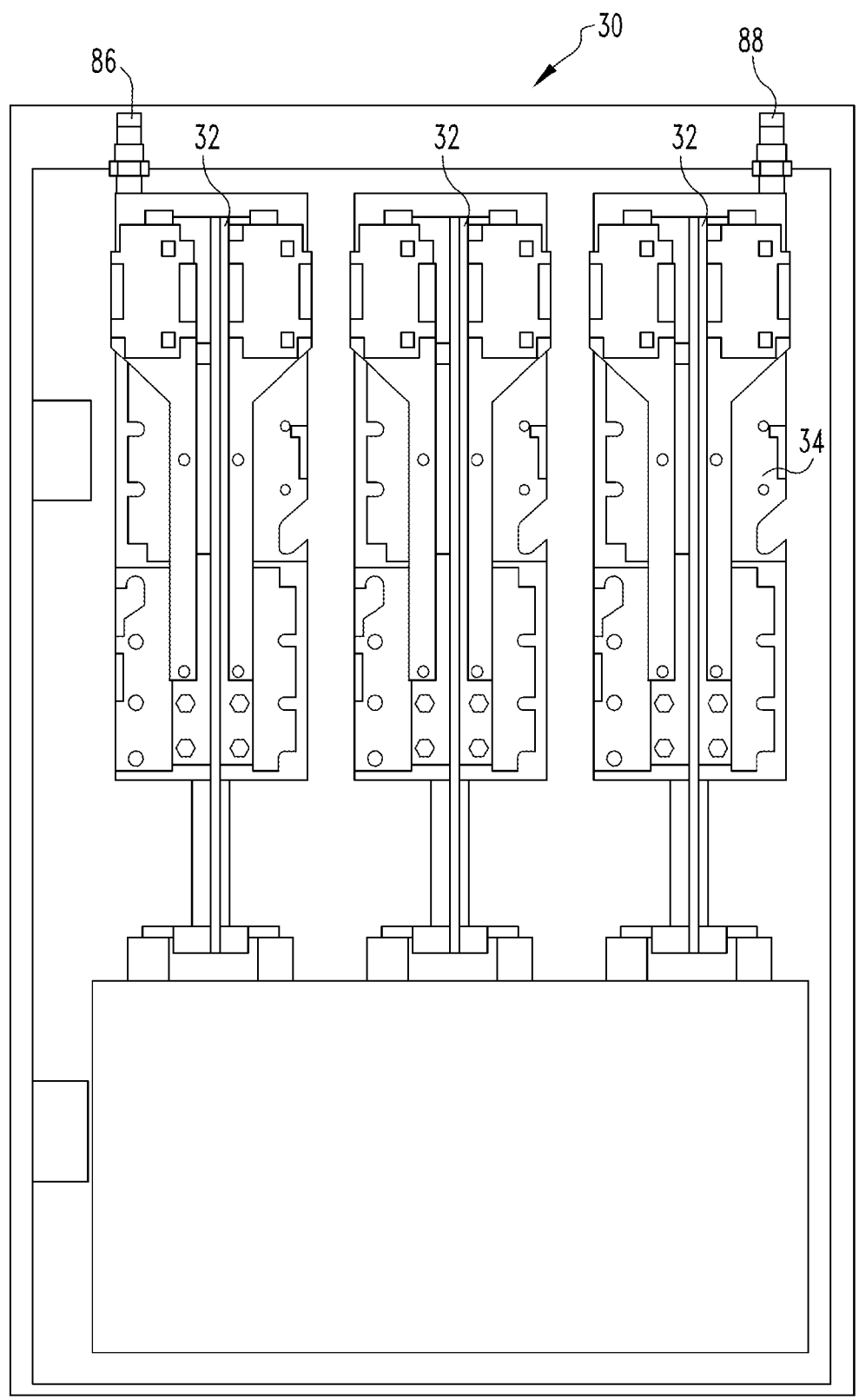
FIG. 2 is a detail front side view of power module.
Figure 3:
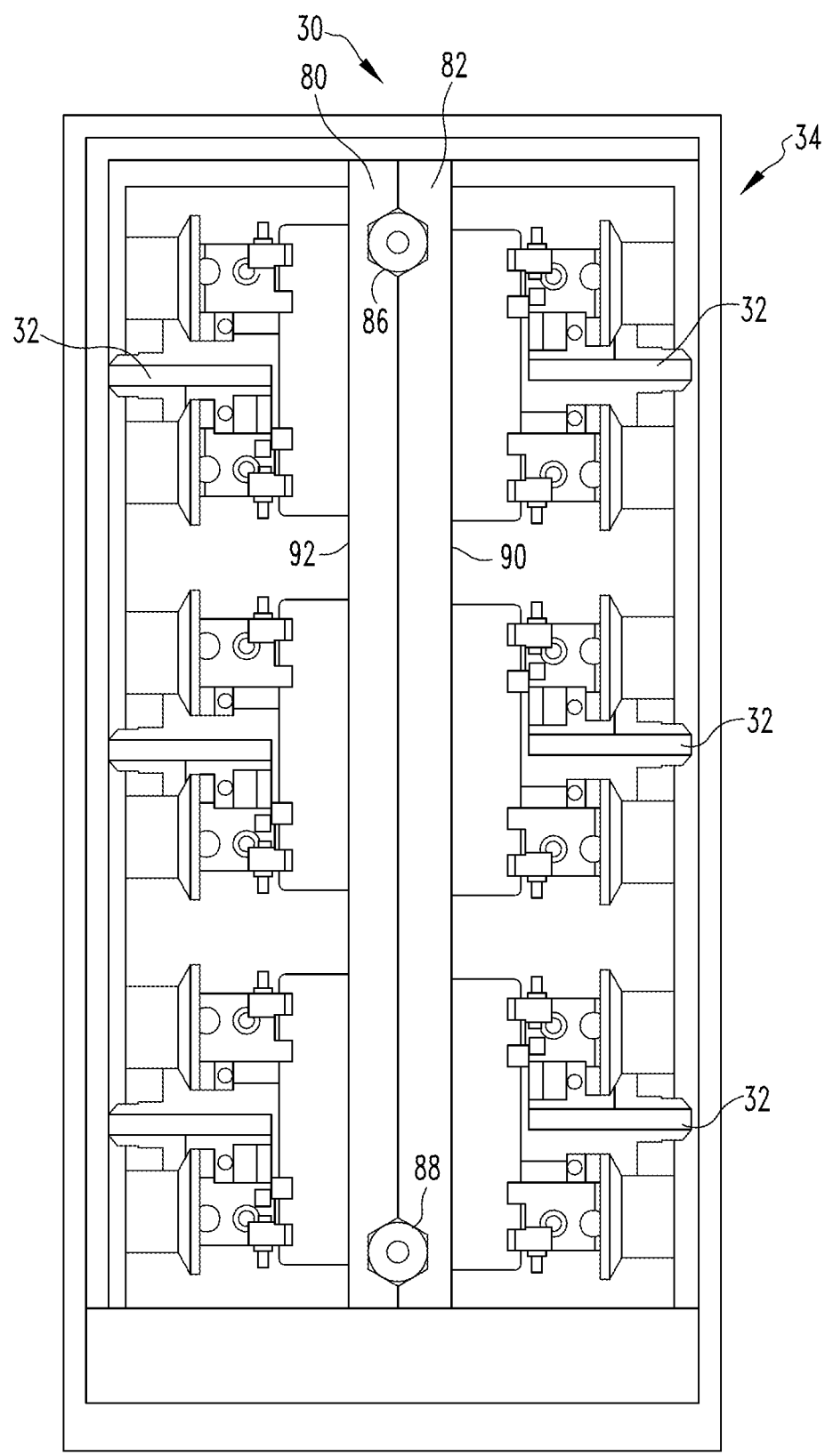
FIG. 3 is a detail top side view of power module.
Figure 4:
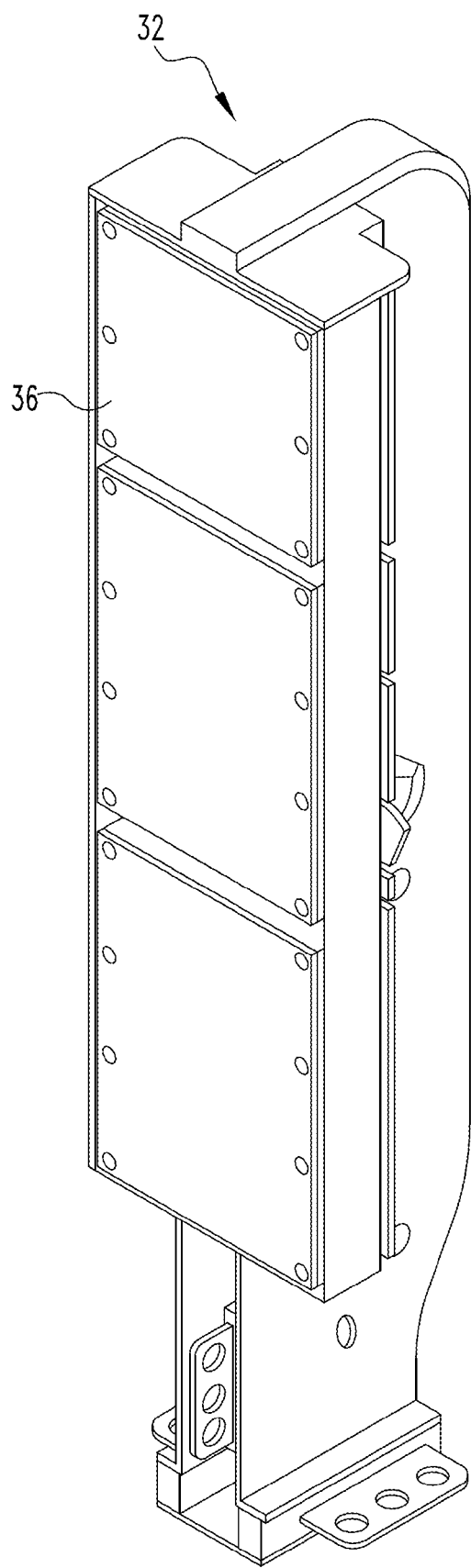
FIG. 4 is an isometric view of an inverter.

The power modules 14 include a number of inverters 30, as shown in FIGS. 2-4. Each inverter 30 includes a number of power poles 32. Each power pole 32 includes a number of components 34 such as, but not limited to, a number of power semiconductor switches, a power supply, a gate driver, a plurality of capacitors, and a plurality of electrical buses. As is known, the electrical buses connect the power semiconductor switches to the capacitors. Further, in an exemplary embodiment, the components 34 further include an insulative medium which encases or covers some or all of the electrically live components. Each power pole 32 is elongated and includes at least one substantially planar surface 36 (FIG. 4). Each power pole 32 is coupled to, and iaee thermally coupled to, a cold plate 72. Further, as discussed below, each power pole 32 is a "stand-alone power pole." As used herein a "stand-alone power pole" is a power pole that lacks a fluid coupling between any component of power pole 32 and a heat management system such as, but not limited to a heat exchanger.

As shown in FIG. 1, the heat management system 16 includes at least two heat management assemblies 40, a first heat management assembly 42 and a second heat management assembly 44. Further, in an exemplary embodiment, the two heat management assemblies 42, 44 operate by different principles. As used herein, a "hybrid heat management system" is a heat management system 16 that includes two heat management assemblies 40, 42 that operate by different principles. Further, an "air/liquid hybrid heat management system" is a heat management system that includes a "conduction with internal fluid flow" heat management system and a "convection" heat management system.

In an exemplary embodiment, the heat management system 16 is an air/liquid hybrid heat management system. Thus, the first heat management assembly 42 is a convection assembly 50 and the second heat management assembly 44 is a conduction with internal fluid flow assembly 70. The convection assembly 50 includes a fluid moving device 52 (shown schematically), such as, but not limited to a fan 54 or an impeller (not shown), a fluid passage 56 and an exhaust 58. The exhaust 58 is disposed adjacent to, and in an exemplary embodiment above, the power modules 14. As shown, in an exemplary embodiment, the exhaust 58 is a number of openings in the power module enclosure 26A. Further, in an exemplary embodiment, the fluid passage 56 is defined by the power module enclosure 26A. That is, air that is external to the power module enclosure 26A is drawn into the power module enclosure 26A, passes over the power modules 14 and exits the power module enclosure 26A via the exhaust 58. In this configuration, the external sidewalls 20 and/or internal sidewalls 24 define the fluid passage 56. As shown, there is no specific inlet for the external air, thus the external air is drawn in through any unsealed opening, such as, but not limited to a gap about the door. The power module enclosure 26A, in another embodiment, includes air inlet openings (not shown). In this configuration, the convection assembly 50 draws external air into the power module enclosure 26A, wherein the air moves across the power modules 14 thereby removing heat by convection, and the heated air is exhausted from the power module enclosure 26A via exhaust 58. Thus, the heat management system 16 includes a first heat management assembly 42 having convection as a principle of operation.

Further, the first heat management assembly 42 is disposed substantially, or entirely, within the power module enclosure 26A. That is, the fluid passage 56 is defined, and therefore within, the power module enclosure 26A and the exhaust 58 is also part of the power module enclosure 26A. The effective portion of the fluid moving device 52, i.e. a fan blade, impeller rotor, or other element that moves a fluid, is disposed within the power module enclosure 26A as well. It is noted, however, that a non-effective portion of the fluid moving device 52, e.g. a motor, may be disposed outside of the power module enclosure 26A. In this configuration, and as used herein, such a first heat management assembly 42 is "substantially disposed in" the power module enclosure 26A.

Figure 5:
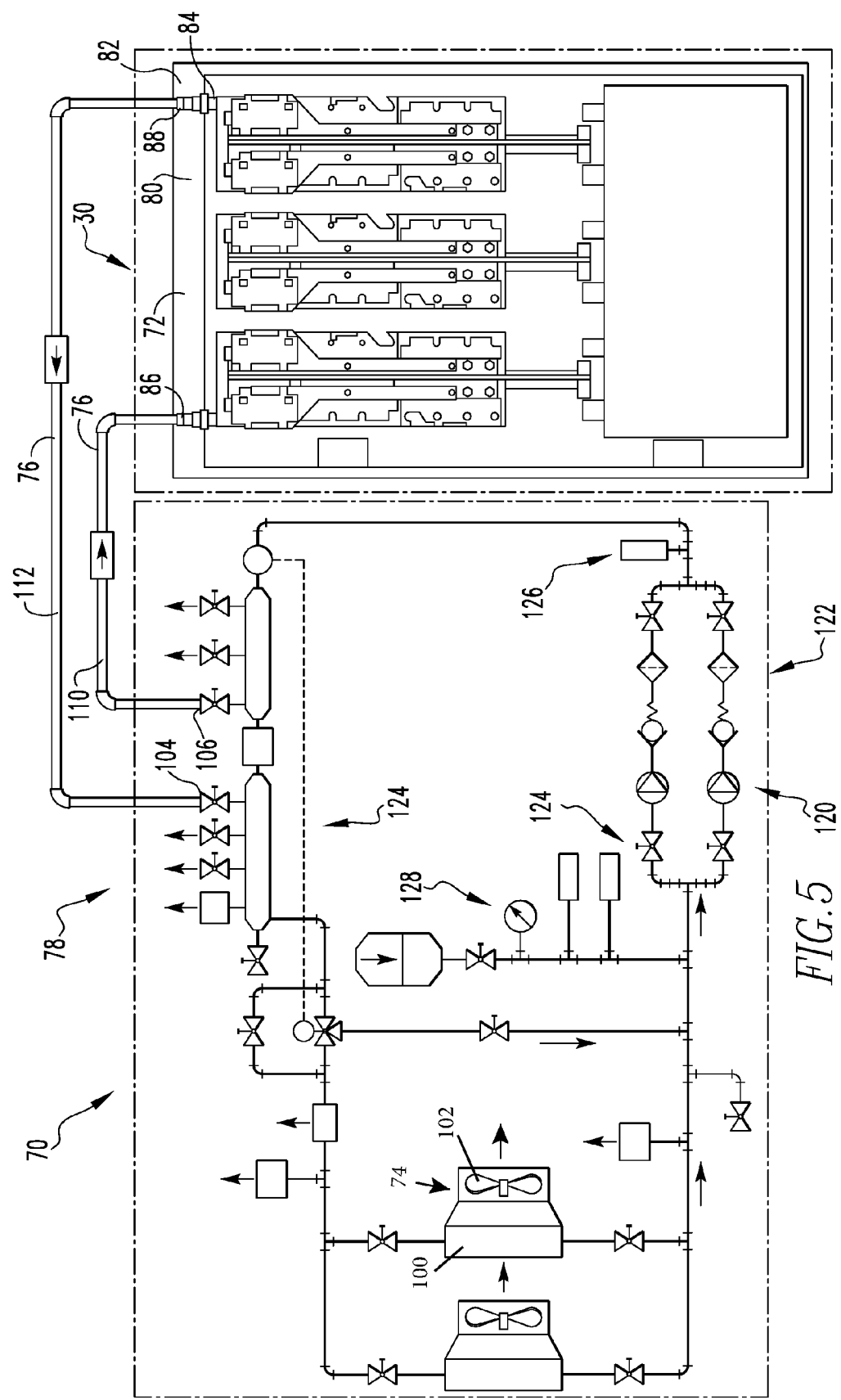
FIG. 5 is a schematic view of a conduction with internal flow assembly.

The second heat management assembly 44 is a conduction with internal fluid flow assembly 70, shown schematically in FIG. 5. A conduction with internal fluid flow assembly 70 includes a cold plate 72, a heat exchanger 74, a number of conduits 76, and a liquid flow control assembly 78. The second heat management assembly 44 is substantially disposed in a liquid cooling assembly enclosure 26B that is separate from the power module enclosure 26A. As used herein, "separate from" means that there is not an open passage between the enclosures 26 whereby fluid, and in an exemplary embodiment air, flows between the two enclosures 26. A fluid in a controlled passage, i.e. in a conduit 76, may flow between two enclosures 26 and maintain the status of the two enclosures 26 as "separate from" each other.

In an exemplary embodiment, the cold plate 72 has a sufficient surface to support, and be thermally coupled to, a number of inverters 30. That is, in an exemplary embodiment, the cold plate 72 is a primary cold plate 80. A primary cold plate 80 is, in an exemplary embodiment, a generally planar body 82 that defines an internal passage 84. The primary cold plate 80 includes a single inlet port 86 and a single outlet port 88. That is, there is not a number of ports that allow fluid communication with a number of cell sized cold plates. Each port, 86, 88 is in fluid communication with the internal passage 84. The primary cold plate 80 further includes a first mounting surface 90 and a second mounting surface 92. Each mounting surface 90, 92, in an exemplary embodiment, has an area of between about 1500.0 in.$^2$ and 2000.0 in.$^2$, or about 1728 in.$^2$. Iaee, the primary cold plate 80 is about 4.0 inches thick.

The heat exchanger 74 is, in an exemplary embodiment, a forced air-liquid heat exchanger. That is, the heat exchanger 74 includes a condenser coil 100 and a fan 102. The heat exchanger 74 further includes an inlet port 104 and an outlet port 106. The heat exchanger 74 is, in an exemplary embodiment, disposed in the liquid cooling assembly enclosure 26B. In another embodiment, not shown, the heat exchanger 74 is disposed at a location spaced from the housing assembly 12.

The conduits 76 include a first conduit 110 and a second conduit 112. The first conduit 110 provides fluid communication between the heat exchanger outlet port 106 and the primary cold plate inlet port 86. The second conduit 112 provides fluid communication between the primary cold plate outlet port 88 and the heat exchanger inlet port 104. A number of other conduits 76 provide fluid communication between the various elements of the liquid flow control assembly 78.

The liquid flow control assembly 78 includes a pump 120, a number of filters 122, a number of valves 124, sensors 126 and gauges 128. The liquid flow control assembly 78 is structured to cycle a liquid, and in an exemplary embodiment a coolant, between the primary cold plate 80 and the heat exchanger 74. The number of valves 124 includes, but is not limited to, shut off valves, non-return check valves and pressure relief valves.

The primary cold plate 80 is disposed in the power module enclosure 26A. The inverters 30 are coupled to, and in an exemplary embodiment directly coupled to the primary cold plate 80. That is, in an exemplary embodiment, each power pole planar surface 36 is thermally coupled to the one of the primary cold plate mounting surfaces 90, 92. The first heat management assembly 42 is, as noted above, disposed substantially, or entirely, within the power module enclosure 26A. The first heat management assembly 42 is positioned to move a fluid, and in an exemplary embodiment air, over the power modules 14 including the inverters 30. Further, in this configuration, each power pole 32 lacks an individual heat exchanger. Thus, as discussed above and below, each power pole 32 is a stand-alone power pole.

The second heat management assembly 44 is not substantially disposed in the power module enclosure 26A. That is, as used herein, with regard to the second heat management assembly 44, "not substantially disposed in" means that the majority of elements, by number, are not disposed in the identified enclosure. That is, while the primary cold plate 80, as well as portions of the first conduit 110 and second conduit 112, are disposed in the power module enclosure 26A, the majority of elements, by number, of the second heat management assembly 44, including but not limited to the liquid flow control assembly 78, are disposed in a location other than in the power module enclosure 26A. Further, it is noted that in a heat management assembly that includes a number of cell cold plates (not shown), the number of cell cold plates are disposed in the power module enclosure 26A. Thus, as used herein, a heat management assembly including a number of cell cold plates disposed in the power module enclosure 26A is "substantially disposed in" the power module enclosure 26A.

Further in this configuration, the power poles 32, and more specifically the inverters 30, are not in fluid communication with the primary cold plate 80. Thus, there is no fluid coupling extending between any power pole 32 and the primary cold plate 80 or other heat management system. Thus, the power poles 32, and more specifically the inverters 30, may be removed without having to decouple a fluid coupling. As such, each power pole 32 is a stand-alone power pole. That is, as there are no fluid couplings to each power pole 32, the removal and installation thereof is simplified.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A heat management system for an adjustable frequency drive, said adjustable frequency drive including a number of power modules, each said power module including a number of inverters, each said inverter including a number of power poles, said heat management system comprising:
   a housing assembly defining a power module enclosure and a liquid cooling assembly enclosure;
   a first heat management assembly substantially disposed in said power module enclosure;
   a second heat management assembly not substantially disposed in said power module enclosure;
   said first heat management assembly is a convection assembly;
   said second heat management assembly is a conduction with internal fluid flow assembly;
   said conduction with internal fluid flow assembly includes a primary cold plate and a heat exchanger;
   said primary cold plate structured to support, and be thermally coupled to, said number of power poles;
   said primary cold plate including a single inlet port and a single outlet port;
   said heat exchanger including an inlet port and an outlet port;
   a first conduit providing fluid communication between said heat exchanger outlet port and said primary cold plate inlet port; and
   a second conduit providing fluid communication between said primary cold plate outlet port and said heat exchanger inlet port.

2. The heat management system of claim 1 wherein:
   said primary cold plate includes a generally planar body defining an internal passage; and
   said passage in fluid communication with said inlet port and said outlet port.

3. An adjustable frequency drive comprising:
   a number of power modules, each said power module including a number of inverters;
   each said inverter including a number of power poles,
   a heat management system including a housing assembly, a first heat management assembly, and a second heat management assembly;
   said housing assembly defining a power module enclosure and a liquid cooling assembly enclosure;
   said first heat management assembly substantially disposed in said power module enclosure;
   said second heat management assembly not substantially disposed in said power module enclosure;
   said first heat management assembly is a convection assembly;
   said second heat management assembly is a conduction with internal fluid flow assembly
   said conduction with internal fluid flow assembly includes a primary cold plate and a heat exchanger;
   said primary cold plate structured to support, and be thermally coupled to, said number of power poles;
   said primary cold plate including a single inlet port and a single outlet port;
   said heat exchanger including an inlet port and an outlet port;

a first conduit providing fluid communication between said heat exchanger outlet port and said primary cold plate inlet port; and a second conduit providing fluid communication between said primary cold plate outlet port and said heat exchanger inlet port.

4. The adjustable frequency drive of claim 3 wherein:

said primary cold plate includes a generally planar body defining an internal passage; and said passage in fluid communication with said inlet port and said outlet port.

* * * * *